(12) United States Patent
Miyamoto

(10) Patent No.: US 7,771,212 B2
(45) Date of Patent: Aug. 10, 2010

(54) ELECTRICAL JUNCTION BOX

(75) Inventor: Takashi Miyamoto, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 12/461,686

(22) Filed: Aug. 20, 2009

(65) Prior Publication Data

US 2010/0105222 A1    Apr. 29, 2010

(30) Foreign Application Priority Data

Oct. 28, 2008    (JP) .............................. 2008-277470

(51) Int. Cl.
*H01R 12/00* (2006.01)
(52) U.S. Cl. ...................... 439/76.2; 439/949
(58) Field of Classification Search ................. 439/76.2, 439/76.01, 949
See application file for complete search history.

(56) References Cited

U.S. PATENT DOCUMENTS

| | | | |
|---|---|---|---|
| 6,325,641 B1* | 12/2001 | Nishiyama et al. | 439/76.2 |
| 6,402,530 B1* | 6/2002 | Saito et al. | 439/76.2 |
| 6,506,060 B2* | 1/2003 | Sumida et al. | 439/76.2 |
| 6,997,737 B2* | 2/2006 | Hiwatashi | 439/474 |
| 7,101,197 B2* | 9/2006 | Naito et al. | 439/75 |
| 7,160,118 B2* | 1/2007 | Shirota | 439/76.2 |
| 7,247,031 B2* | 7/2007 | Naito et al. | 439/75 |
| 7,387,516 B2* | 6/2008 | Hayakawa et al. | 439/76.2 |
| 7,390,198 B2* | 6/2008 | Oka et al. | 439/76.2 |
| 7,419,386 B2* | 9/2008 | Washihira | 439/76.2 |
| 2006/0154499 A1* | 7/2006 | Naito et al. | 439/76.2 |
| 2007/0020968 A1* | 1/2007 | Oka | 439/76.2 |
| 2008/0014767 A1* | 1/2008 | Oka et al. | 439/76.2 |
| 2008/0038943 A1* | 2/2008 | Hayakawa et al. | 439/76.2 |

FOREIGN PATENT DOCUMENTS

| | | |
|---|---|---|
| JP | A-09-284952 | 10/1997 |
| JP | A-2000-08331 | 3/2000 |
| JP | A-2001-197628 | 7/2001 |
| JP | A-2006-311693 | 11/2006 |

* cited by examiner

*Primary Examiner*—T C Patel
*Assistant Examiner*—Vladimir Imas
(74) *Attorney, Agent, or Firm*—Oliff & Berridge, PLC

(57) ABSTRACT

Bus bars to be contained in an electrical junction box are secured to insulation plates without caulking. An electrical junction box contains bus bars in a casing. The bus bars are disposed on an inner surface of the casing. Attaching pieces provided on the bus bars are inserted into and secured to receiving apertures provided in the casing. The attaching piece of each bus bar has a rectangular shape in cross section. Each receiving aperture in the casing is a circular aperture or a rectangular aperture. At least a part of an outer peripheral wall of each attaching piece contacts with an inner peripheral surface of each receiving aperture to restrain the attaching piece from moving in the aperture.

4 Claims, 10 Drawing Sheets

[Fig. 1]
(A)
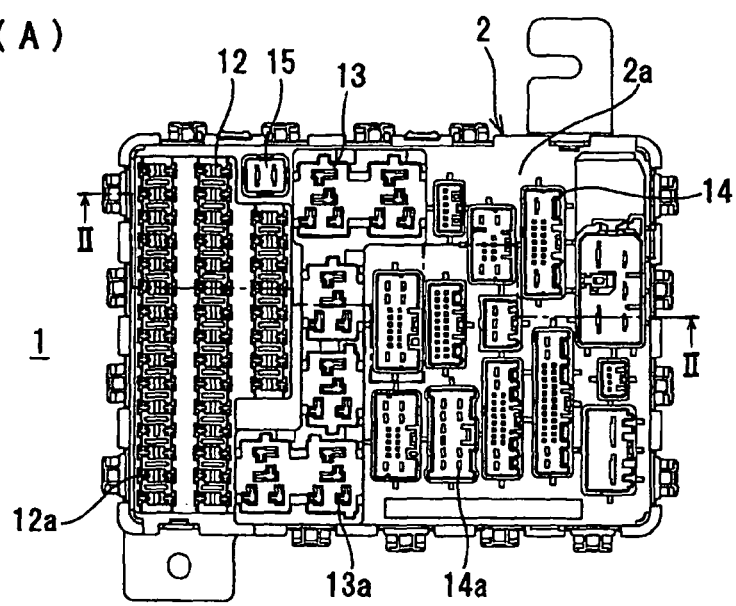
(B)
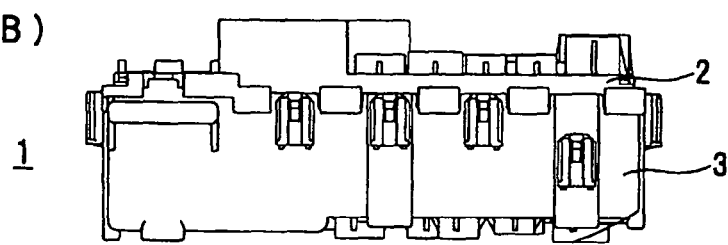
(C)
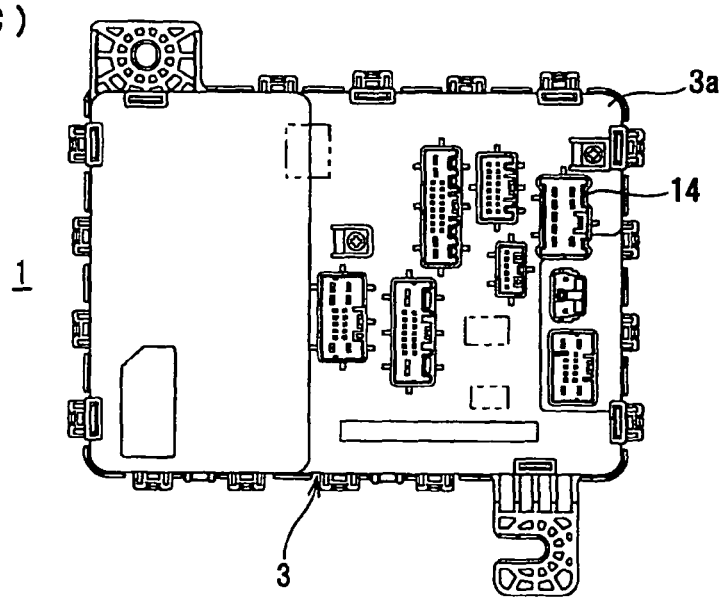

[Fig. 2]
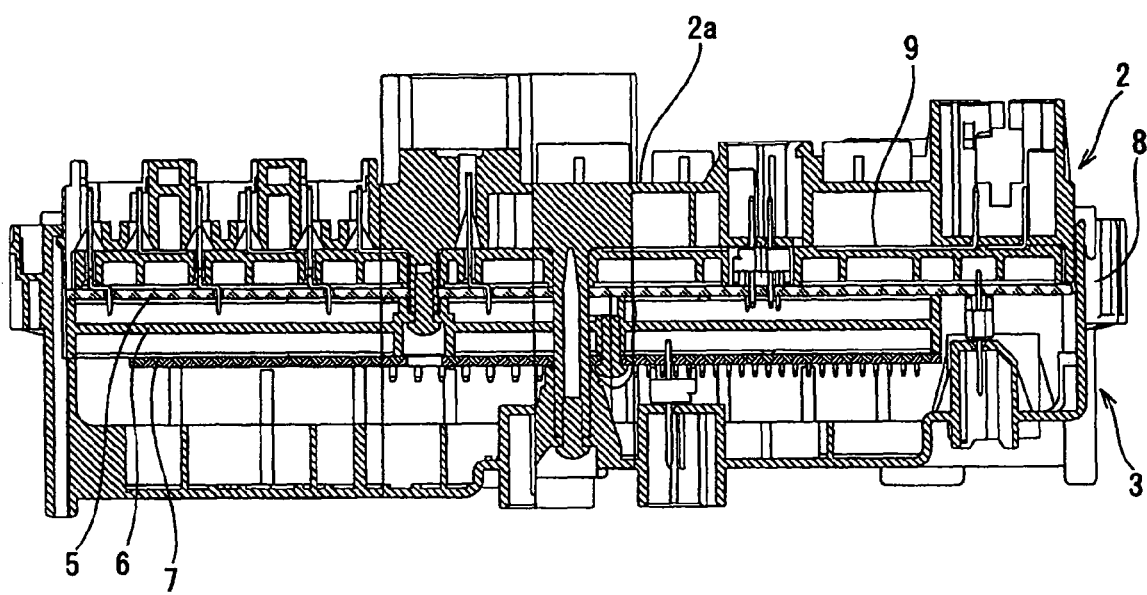

[Fig. 3]
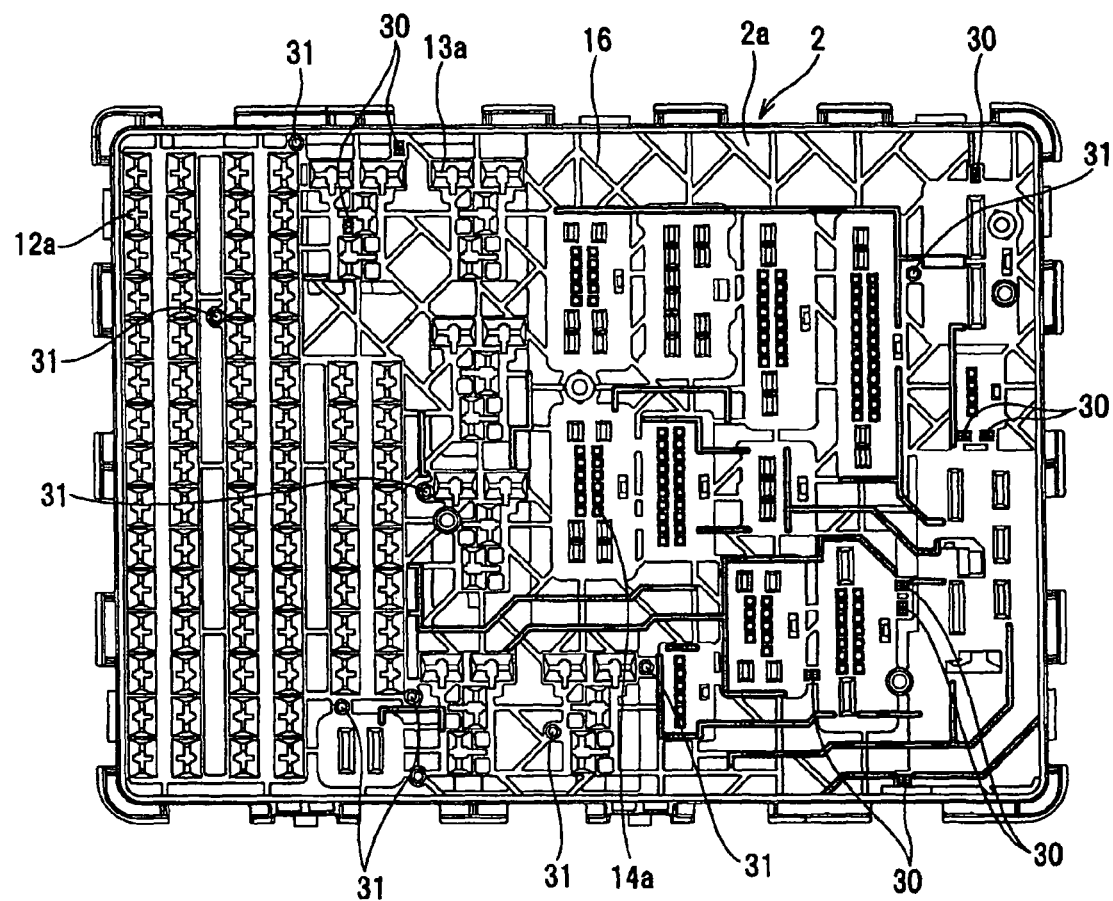

[Fig. 4]
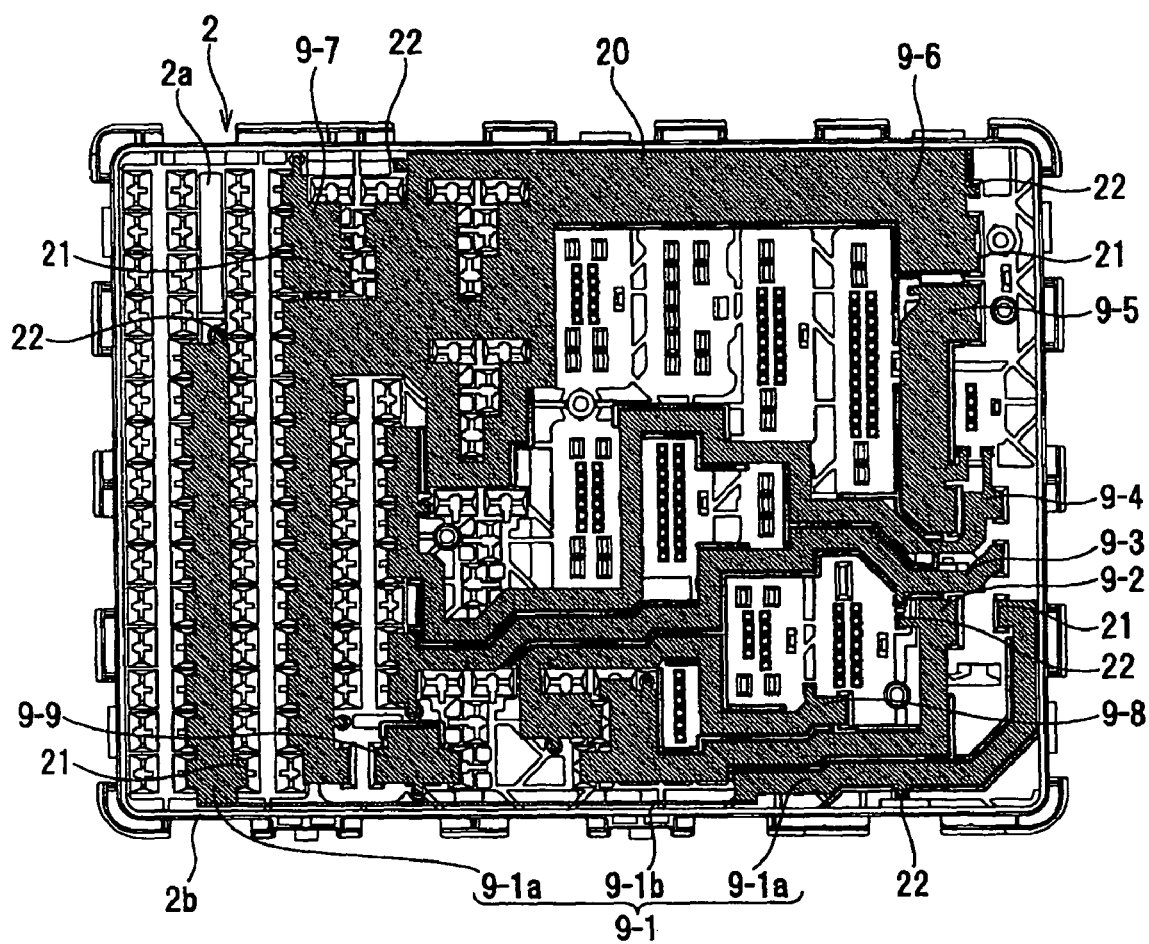

[Fig. 5]
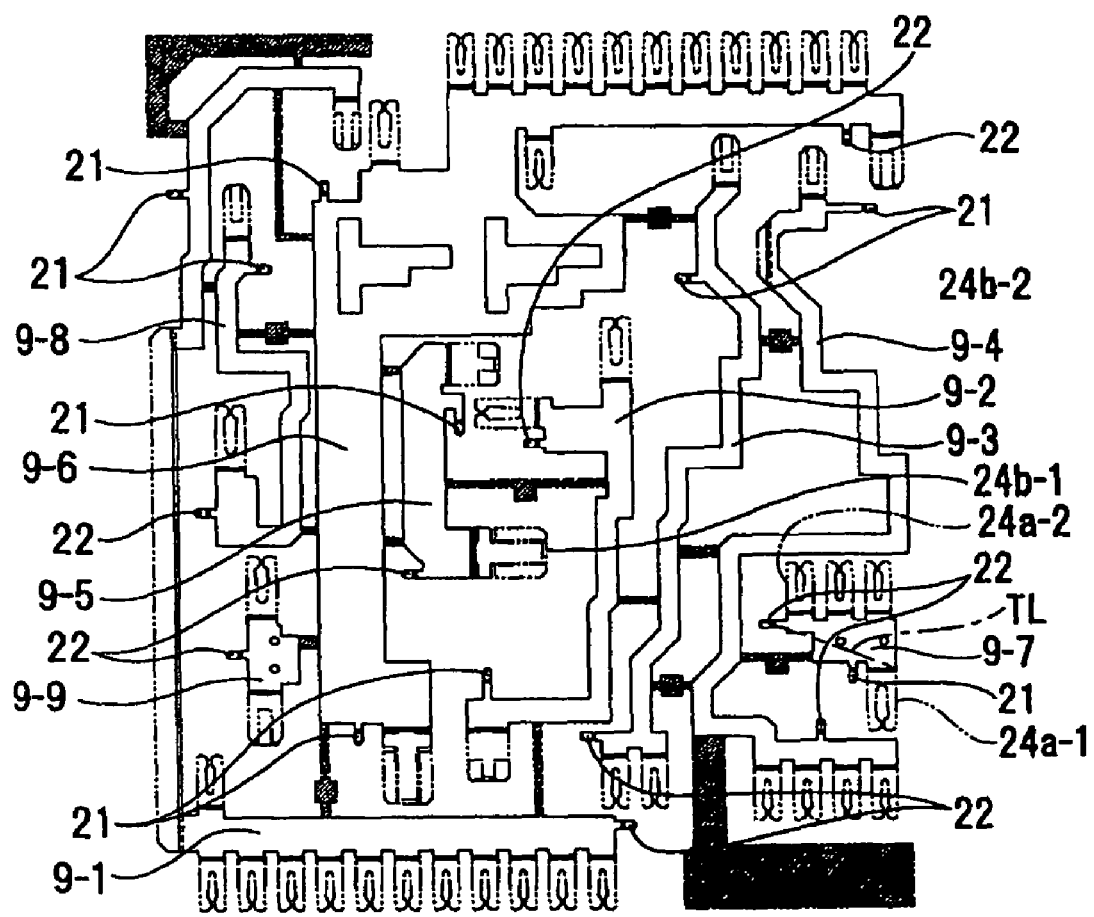

[Fig. 6]
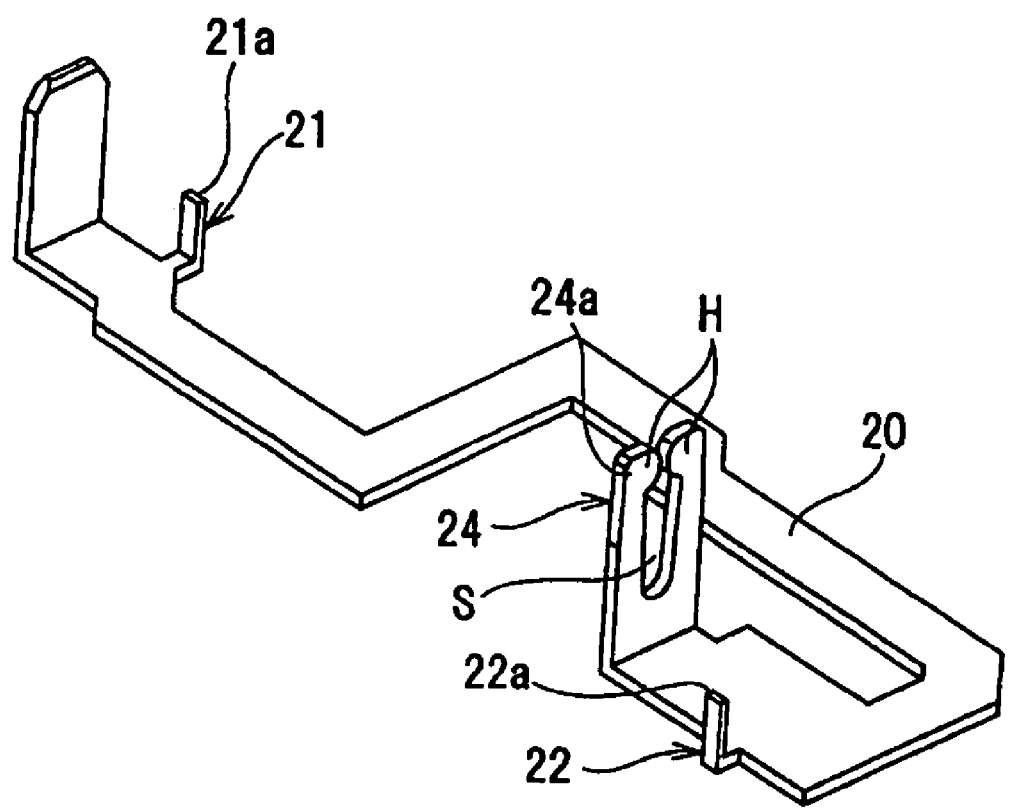

[Fig. 7]
(A)
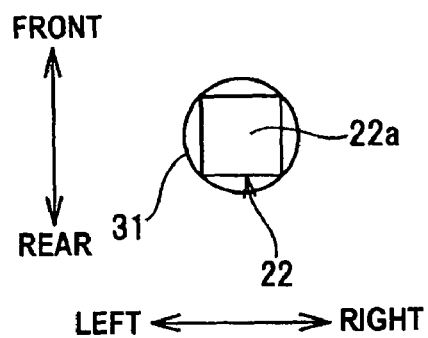
(B)
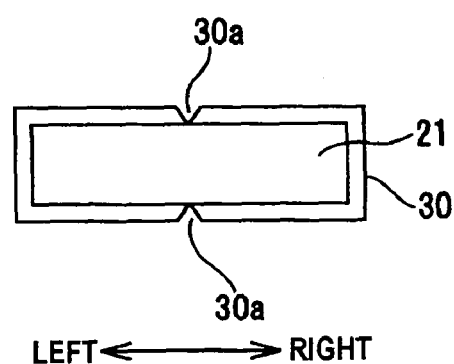

[Fig. 8]
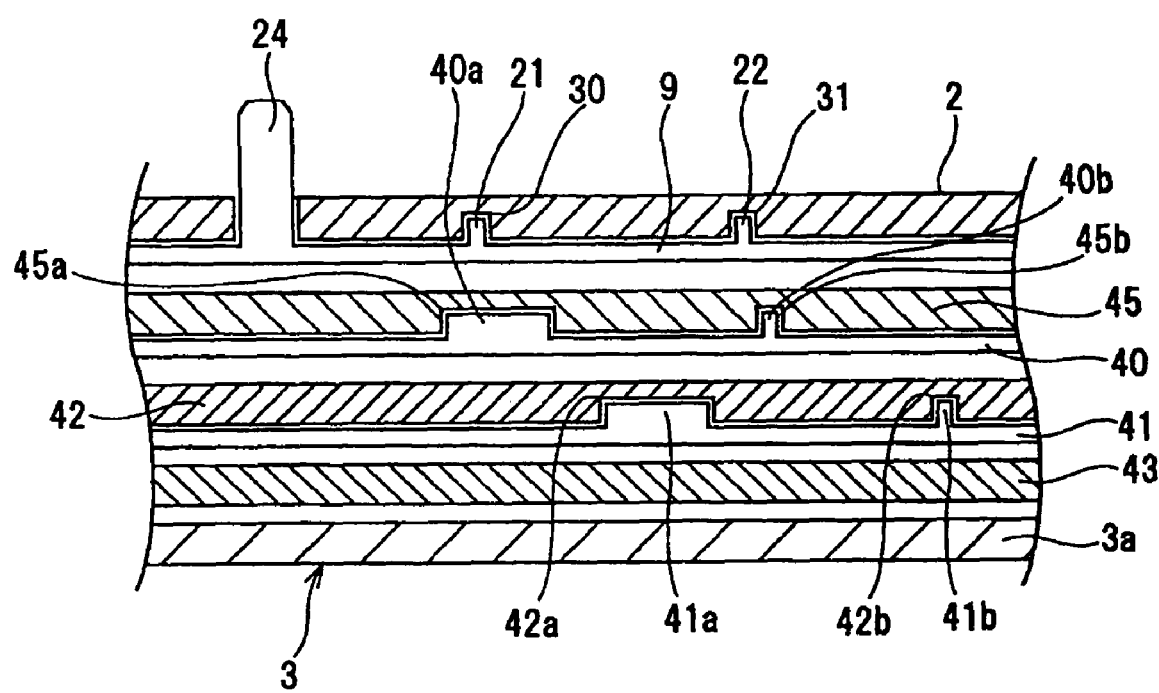

[Fig. 9]
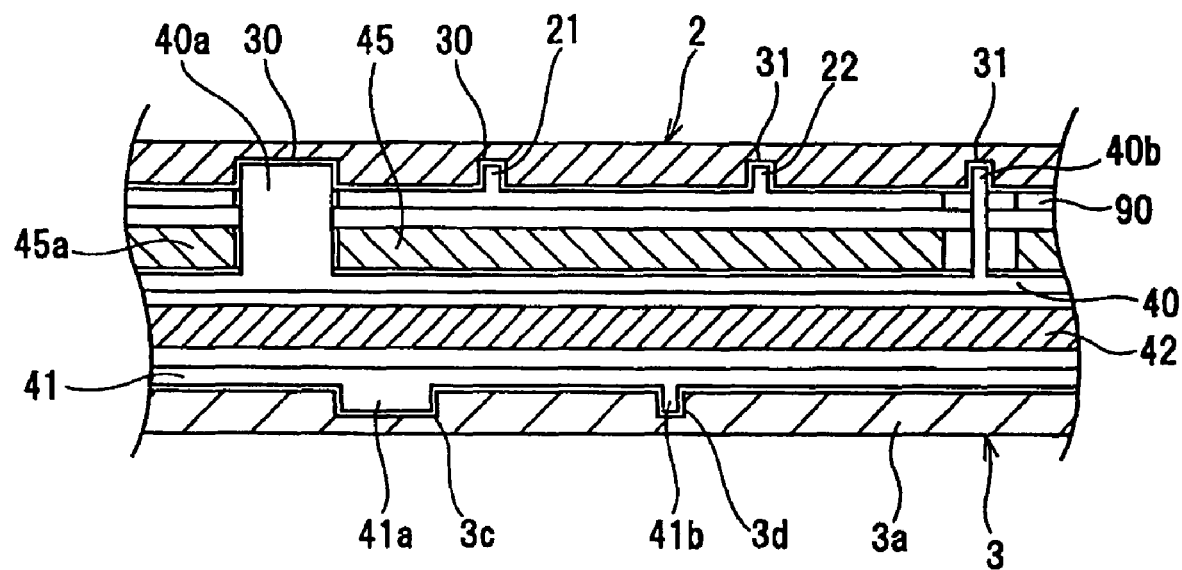

[Fig. 10]
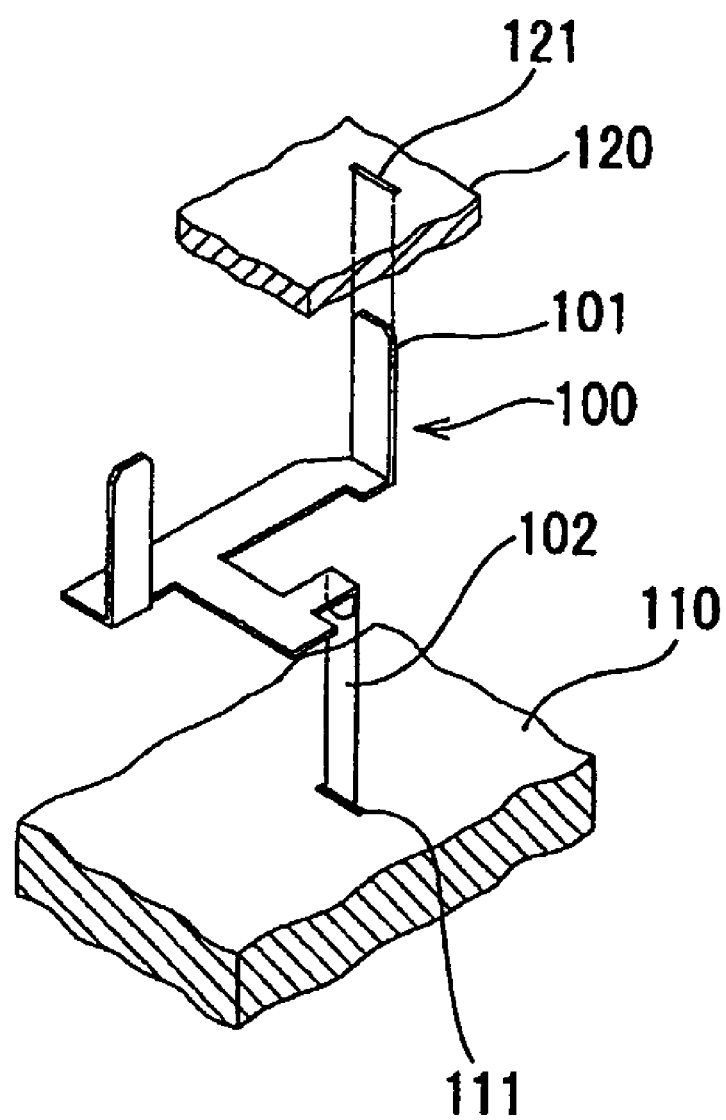

ELECTRICAL JUNCTION BOX

CROSS-REFERENCE TO RELATED APPLICATION

This application claims priority to JP 2008-277470 filed in Japan on Oct. 28, 2008, the disclosure of which is hereby incorporated by reference in its entirety.

BACKGROUND

1. Technical Field

The exemplary embodiments are directed to an electrical junction box, and more particularly to a vehicle-mounted electrical junction box that can contain bus bars in a casing so as to readily and precisely position and fix the bus bars in the casing.

2. Background Art

A vehicle-mounted electrical junction box or the like contains circuit members including bus bars in a high-density manner in an interior. Usually, a plurality of bus bars and insulation plates are laminated alternately. Ribs provided on the insulation plates are inserted into caulking apertures to be caulked on the bus bars. A laminated body in which a plurality of the bus bars and insulation plates are integrally secured to one another is held on support portions or frames projecting from an inner surface of a casing. Tabs projecting from the bus bars secured to the insulation plates are inserted into terminal apertures provided in a connector-containing section, a fuse-containing section, or a relay-containing section in the casing. Thus, the bus bars are secured to the insulation plates and the tabs projecting from the bus bars are held in the terminal apertures in the casing.

For example, FIG. 10 illustrates a process for producing a wiring plate assembly for electrical junction, which has been disclosed in JP HEI 9 (1997)-284952 A (assigned to the present applicant). As shown in FIG. 10, a bus bar 100 includes an upright tab 101 and a dummy tab 102 bent downward in an opposite direction from the tab 101. The dummy tab 102 is inserted into and secured to a positioning recess 111 in a lower jig 110 for lamination. Then, the tab 101 is inserted into a terminal aperture 121 in an insulation plate 120 disposed above the bus bar 100.

However, even in the above-described process, the bus bar 100 is previously provided with caulking apertures at desired positions to secure the bus bar 100 to the insulation plate 120 by caulking (see paragraph [0022] in JP HEI 9 (1997)-284952 A). Also, the above-described process requires that the dummy tab 102 be provided on the bus bar 100 and the lower jig 110 for lamination, which must be prepared to receive and hold the dummy tab 102.

SUMMARY

Problems that the Invention is to Solve

As described above, heretofore, the bus bars to be contained in the electrical junction box are secured to the insulation plates by caulking. However, in order to hold the bus bars on the insulation plates by caulking, it is necessary to carry out the caulking after many ribs on the insulation plates have been inserted into the caulking apertures in the bus bars. This will increase the number of working steps. Furthermore, the insulation plates that are required to hold the bus bars and the insulation plate must be disposed above or below the bus bars. This will increase a weight and a size of the electrical junction box.

The exemplary embodiments address the above noted problems with an electrical junction box in which bus bars are precisely positioned and held in a casing without caulking the bus bars onto insulation plates.

The electrical junction box has a casing with an inner surface and receiving apertures. Bus bars are disposed on the inner surface of the casing. Attaching pieces disposed on the bus bars are inserted into and secured to the receiving apertures of the casing. Each of the attaching pieces having a rectangular cross-section, each of the receiving apertures being circular or rectangular, and at least a part of an outer peripheral wall of each attaching piece contacting with an inner peripheral surface of each receiving aperture to restrain the attaching piece from moving in the aperture, thereby positioning and holding the bus bars in the casing.

As described above, the electrical junction box according to the exemplary embodiments utilizes the upper wall or the bottom wall of the casing to secure the bus bars. The attaching pieces disposed on the bus bars are directly pressed into the receiving apertures in the upper wall or the bottom wall to utilize the casing itself as a securing member for the bus bars, thereby positioning and holding the bus bars in the casing without caulking the bus bars onto the insulation plate.

Because each attaching piece of each bus bar is rectangular while each receiving aperture is circular or rectangular, and because at least a part of the outer peripheral wall of each attaching piece contacts with an inner peripheral surface of each receiving aperture, it is possible to precisely position and hold the bus bars in the casing.

Thus, it is possible to eliminate or reduce the number of insulation plates used for securing a bus bar.

When each circular aperture in the casing receives each attaching piece of the bus bar having a rectangular shape in cross section, four corners of the attaching piece contacts with the inner peripheral surface of the circular aperture, thereby restraining the attaching piece from moving laterally or longitudinally. Because the rectangular aperture has the same shape as the cross section of the attaching piece, it is possible to restrain rotary movement of the attaching piece.

Thus, the shape of the receiving aperture in the casing can restrain the attaching piece of the bus bar from moving laterally or longitudinally, thereby surely and precisely securing the bus bar to the inner surface of the casing.

If the casing of the electrical junction box includes an upper casing member and a lower casing member, the bus bars are directly secured to either an upper wall of the upper casing member or a bottom wall of the lower casing member or to both casing members in the manner described above.

If the casing of the electrical junction box includes only one casing member, the bus bars are directly secured to a bottom wall of the casing.

Furthermore, if other bus bars, except the bus bars that are directly secured to the inner surface of the casing, are contained in the casing, the other bus bars are not caulked on an insulation plate. In an exemplary embodiment, the other bus bars are provided with a plurality of bent attaching pieces and inserted into and secured to receiving apertures in the insulation plate or are penetrated into openings defined by the insulation plate to project toward the casing so as to be inserted into and secured to receiving apertures in the inner surface of the casing.

Each attaching piece of each of the other bus bars is rectangular as is in the case with the bus bars described above, while each receiving aperture in the insulation plate is circular as in the case with the receiving aperture in the casing.

According to the above structure, it is possible to contain all of the bus bars laminated in multi-layers in the casing without caulking the bus bars onto the insulation plate.

Even if the bus bars are not secured to the upper wall or the lower wall of the casing directly, and the bus bars and insulation plates are laminated alternately, it is possible to reduce or eliminate all of the steps of caulking the bus bars onto the insulation plates by inserting the attaching pieces projecting from the bus bars into the receiving apertures in the inner surface of the casing.

In an exemplary embodiment, the rectangular aperture is provided with opposed inner peripheral surfaces and a rib and the rib is brought into contact with an outer peripheral surface of the attaching piece.

In particular, because the attaching piece is likely to move in a direction perpendicular to a long side of the rectangular aperture in the aperture, if the ribs are provided on the two opposed long sides of the rectangular aperture, it is possible to surely prevent the attaching piece from moving in the direction perpendicular to the long side of the rectangular aperture.

In an exemplary embodiment, a part of each of the bus bars is bent upward to provide a tab terminal adapted to be connected to electrical components, and each of the attaching pieces is bent in the same direction as that of the upward bent tab terminal.

Thus, if the attaching piece projects in the same direction as the tab terminal, it is possible to enhance a precision of positioning the tab terminal.

Because the connector-containing section, fuse-containing section, and relay-containing section are provided on the upper wall of the upper casing member and the bottom wall of the lower casing, if the attaching pieces of the bus bars are directly secured to the receiving apertures in the casing, it is possible to shorten a length of the tab terminal that is bent from each bus bar and projected to each containing section in the casing.

In an exemplary embodiment, the attaching piece to be inserted into and secured to the circular aperture is disposed near the tab terminal.

It is possible to restrain the attaching piece from moving laterally or longitudinally, when the attaching piece is inserted into and secured to the circular aperture. Consequently, it is possible to project the tab terminal in a proper posture from the tab terminal through-hole in the connector-containing section or the like and to enhance alignment of the tab, when the tab terminal is inserted into the tab terminal through-hole.

Effects of the Invention

As described above, in the electrical junction box according to the exemplary embodiments, because the bus bars are directly secured to the inner surface of the casing without caulking the bus bars onto the insulation plate, it is possible to eliminate the steps of caulking the bus bars onto the insulation plate, thereby lowering a cost in production.

In addition, it is possible to eliminate the insulation plate itself for securing the bus bar to be fixed on the casing, thereby decreasing the number of parts, facilitating weight reduction and downsizing of the electrical junction box.

BRIEF DESCRIPTION OF THE DRAWINGS

FIG. 1A is a plan view of a first embodiment of an electrical junction box in accordance with the present invention. FIG. 1B is a front elevation view of the electrical junction box shown in FIG. 1A. FIG. 1C is a bottom side view of the electrical junction box shown in FIG. 1A.

FIG. 2 is a longitudinal section view of the electrical junction box taken along lines II-II in FIG. 1A.

FIG. 3 is a plan view of an upper casing member, illustrating an interior of the upper casing member.

FIG. 4 is a plan view of an upper casing member, illustrating an interior of the upper casing member to which bus bars are attached.

FIG. 5 is a plan view of the bus bars.

FIG. 6 is perspective view of a bus bar.

FIG. 7A is a plan view of a second attaching piece of the bus bar, illustrating a relationship between the second attaching piece and a circular aperture in the upper casing member.

FIG. 7B is a plan view of a first attaching piece of the bus bar, illustrating a relationship between the first attaching piece and a rectangular aperture in the upper casing member.

FIGS. 8 is a partial section view of a second embodiment of the electrical junction box in accordance with the present invention.

FIG. 9 is a partial section view of a third embodiment of the electrical junction box in accordance with the present invention.

FIG. 10 is a perspective view of a bus bar in a related art electrical junction plate.

DETAILED DESCRIPTION OF EMBODIMENTS

Referring now to the drawings, embodiments of an electrical junction box will be described below.

An electrical junction box 1 shown in FIGS. 1A to 1C is mounted in a motor vehicle. FIG. 1A is a plan view of a first embodiment of the electrical junction box 1. FIG. 1B is a front elevation view of the electrical junction box 1 shown in FIG. 1A. FIG. 1C is a bottom side view of the electrical junction box 1 shown in FIG. 1A. FIG. 2 is a longitudinal section view of the electrical junction box taken along lines II-II in FIG. 1A.

The electrical junction box 1 includes an upper casing member 2 and a lower casing member 3. The casing members 2 and 3 constitute a casing by locking them to each other. In an interior of the casing, bus bars 9 are directly secured to an inner surface of an upper wall 2a of the upper casing member 2. A printed board assembly includes an upper layer printed board 5 and a lower layer printed board 7. An insulation plate 6 is disposed between the upper layer printed board 5 and the lower layer printed board 7. The printed board assembly is disposed between the bus bars 9 and an insulation plate 8.

As shown in FIG. 1A, the upper casing member 2 is provided on the upper wall 2a with a fuse-containing section 12, a relay-containing section 13, a connector-containing section 14, and a fusible-link-containing section 15. Peripheral walls of the sections 13 to 15 project outward from an outer surface of the upper wall 2a. Tab terminal through-holes 12a, 13a, 14a, and 15a are provided in the upper wall 2a that defines bottom walls of the respective sections 13 to 15. As shown in FIG. 1C, the lower casing member 3 is also provided on a bottom wall 3a with a connector-containing section 14.

The bus bars 9 are attached to the inner surface of the upper wall 2a of the upper casing member 2. The inner surface of the upper wall 2a is formed into a configuration shown in FIG. 3. FIG. 4 shows the inner surface of the upper wall 2a to which the bus bars 9 are attached. A reference number 16 in FIG. 3 designates reinforcement ribs.

A plurality of bus bars 9 (9-1 to 9-9) are formed by punching out a sheet of a conductive plate along a given pattern and then cutting the punched sheet. The bus bars 9 are attached to the inner surface of the upper wall 2a of the upper casing member 2. FIG. 5 shows a development plan view of the respective bus bars 9-1 to 9-9.

As shown in FIG. 6, each of the bus bars 9 (9-1 to 9-9) includes a main body portion 20 and a tab terminal 24. The main body portion 20 is disposed horizontally along the upper wall 2a of the casing 2. The tab terminal 24 stands upward from the main body portion 20 so that the tab terminal 24 penetrates each of tab terminal through-apertures 12a, 13a, 14a, and 15a in the fuse-containing section 12, relay-containing section 13, connector-containing section 14, and fusible-link-containing section 15. Each tab terminal 24 includes a tuning fork type tab terminal portion 24a that penetrates the tab terminal through-aperture 12a in the fuse-containing section 12 and/or the tab terminal through-aperture 13a in the relay-containing section 13, and a male tab terminal portion 24b that penetrates the tab terminal through-aperture 14a in the connector-containing section 14 and/or the tab terminal through-aperture 15a in the fusible-link-containing section 15.

A first attaching piece 21 and a second attaching piece 22 that have rectangular shapes in cross section are provided on a peripheral edge of the main body portion 20 so that the pieces 21 and 22 are spaced apart from each other and are directed outward. As shown in FIG. 6, the first and second attaching pieces 21 and 22 are provided with projecting ends 21a and 22a by bending the pieces 21 and 22 upward to the same directions by a pressing machine (not shown) to form L-shaped configurations. Similarly, the tab terminal 24 is bent in the same direction as the bent directions of the first and second attaching pieces 21 and 22.

Although the first and second attaching pieces 21 and 22 have substantially the same dimensions in width and thickness and the projecting ends 21a and 22a have substantially the same dimensions in height in the first embodiment, these dimensions in width, thickness, and height may be different and they may be set to be desired dimensions, if necessary.

Each of the bus bars 9-1 to 9-4, 9-6, and 9-8 is provided on opposite ends in a longitudinal direction of the main body portion 20 with a tuning fork type tab terminal 24a and a male tab terminal 24b. The second attaching piece 22 is provided near the tuning fork type tab terminal 24a while the first attaching piece 21 is provided near the male tab terminal 24b. The bus bar 9-6 has two first attaching pieces 21 and one second attaching piece 21, because the whole length and area of the bus bar 9-6 is greater than those of the other bus bars.

The bus bar 9-5 is provided on opposite ends in a longitudinal direction of the main body portion 20 with male tab terminals 24b-1 and 24b-2. The male tab terminal 24b-1 has dimensions in width and projecting height greater than those of the male tab terminal 24b-2. The second attaching piece 22 is provided near the male tab terminal 24b-1 while the first attaching piece 21 is provided near the male tab terminal 24b-2.

The bus bar 9-7 is provided on opposite end sides in a widthwise direction of the main body portion 20 with a plurality of tuning fork type tab terminals 24a. The first and second attaching pieces 21 and 22 are provided near the tuning fork type tab terminals 24a-1 and 24a-2 that are most spaced apart from each other.

The bus bar 9-9 is provided on opposite ends in a longitudinal direction of the main body portion 20 with a tuning fork type tab terminal 24a and a male tab terminal 24b. The bus bar 9-9 is different from the other bus bars. That is, the first and second attaching pieces 21 and 22 are not provided near the tuning fork type tab terminal 24a and male tab terminal 24b. Only the second attaching piece 22 is provided substantially on an intermediate position between the tuning fork type tab terminal 24a and the male tab terminal 24b, because the dimensions in whole length and projecting height of the bus bar 9-9 are smaller than those of the other bus bars.

As described above, in an exemplary embodiment, a bus bar having relatively great whole length and/or area out of the bus bars 9 provided with the tab terminals 24 on the main body portions 20 is provided on the opposite ends with the first and second attaching pieces 21 and 22 that are spaced apart from each other as far as possible. However, it is not always necessary that the bus bar having relatively small whole length and/or area out of the bus bars 9 must be provided with both of the first and second attaching pieces 21 and 22. Either attaching piece may be provided on the bus bar.

Accordingly, arranging positions, numbers, dimensions, and the like of the attaching pieces can be altered in accordance with the whole lengths and areas, and configurations of these bus bars, and specifications and internal circuit layouts of the electrical junction box.

On the other hand, the upper casing member 2 is provided in the upper wall 2a with receiving apertures that are open in the inner surface of the wall 2a. The receiving apertures include rectangular apertures 30 that receive and fix the projecting ends 21a of the first attaching pieces 21 of the bus bars 9 and circular apertures 31 that receive and fix the projecting ends 22a of the second attaching pieces 22.

As shown in FIG. 7A, each circular aperture 31 has an inner diameter that contacts with four corners of the projecting end 22a of the second attaching piece 22 so that the circular aperture 31 can restrain the projecting end 22a from moving laterally or longitudinally.

As shown in FIG. 7B, each rectangular aperture 30 has substantially the same configuration as that of the first attaching piece 21. The rectangular aperture 30 is provided on a central position of each long side with ribs 30a that are projected inward and opposed to each other so that the aperture 30 can press the outer surface of the first attaching piece 21 and restrain the first attaching piece 21 from moving longitudinally.

When the second attaching piece 22 is inserted into the circular aperture 31, an inserting force will be slightly great on account of contacts with the four corners of the projecting ends 22a. However, when the tab terminals 24 are inserted into the tab terminal through-holes 12a to 15a, it is possible to project the tab terminals 24 from the holes in a proper posture, thereby enhancing alignment of the tab terminals 24. In an exemplary embodiment, the second attaching piece 22 to be inserted into the circular aperture 31 is disposed near the tuning fork type tab terminal 24a. The tuning fork type tab terminal 24a includes two clamping pieces H that are provided on central parts with slits S. In the case where the tuning fork type tab terminal 24a is inserted into the tab terminal through-hole in an improper posture, for example, when a central axis of the slit S is deviated in the fuse-containing section 12 and/or the relay-containing section 13, the two clamping pieces H cannot be widened outward through the slits S upon fitting the electrical components and a stress caused upon fitting the electrical components will be concentrated into only one of the clamping pieces. Consequently, the clamping pieces will be extremely deformed or will be broken in some cases.

When each first attaching piece 21 is inserted into each rectangular aperture 30, it is possible to restrain the piece 21 from turning in the aperture 30, because the piece 21 and aperture 30 are formed into the substantially same shape. If a slight clearance is caused between the first attaching piece 21 and the rectangular aperture 30, there is a possibility that the piece 21 moves slightly a lateral or longitudinal direction. However, it is possible for the ribs 30a to restrain the piece 21 from moving in at least a widthwise direction in the rectangular aperture 30.

In an exemplary embodiment, the first attaching piece 21 to be inserted into the rectangular aperture 30 is disposed particularly near the male tab terminal 24b. The male tab terminal 24b is positioned by the first attaching piece 21 and rectangular aperture 30. However, as described above, there will be a possibility that the male tab terminal 24b projects from the tab terminal through-hole 14a or 15a in the connector-containing section 14 or the fusible-link-containing section 15 with the terminal 24b being shifted in the through-hole 14a or 15a. Because the electrical components to be connected to the male tab terminals 24b are female connectors or the like that contain female terminals (not shown) in cavities, C-shaped surfaces provided on distal ends of the cavities can correct postures of the male tab terminals 24b.

When the first attaching pieces 21 are inserted into and secured to the rectangular apertures 30 in the upper casing member 2 and the second attaching pieces 22 are inserted into and secured to the circular apertures 31 in the upper casing member 2, it is possible to restrain the bus bars 9 from turning and moving laterally or longitudinally and to precisely position and hold the bus bars 9 on the inner surface of the upper wall 2a of the upper casing member 2. Consequently, it is possible to precisely align the tuning fork type terminal 24a that is required for serious alignment.

When the electrical components (not shown) such as relays, fuses, connectors are fitted to the tab terminals 24 provided on the bus bars 9, the bus bars will cause a rotary movement, or a lateral or longitudinal movement. In particular, the tuning fork type tab terminal 24a will receive a force for outward widening the clamping pieces H through the central slit S upon fitting the electrical components to the terminal 24a. There is a possibility that the bus bars 9 will cause the lateral or longitudinal movement in accordance with the widening direction. Accordingly, the projecting end 22a of each second attaching piece 22 provided near the tuning fork type tab terminal 24a is inserted into and secured to the circular aperture 31 while the projecting end 21a of each first attaching piece 21 provided near the male tab terminal 24b is inserted into and secured to the rectangular aperture 31. Thus, it is possible to restrain the respective bus bars 9 from causing the rotary movement, lateral or longitudinal movement that is generated by a stress upon fitting of the electrical components and to surely position and hold the bus bars 9 in the upper casing member 2.

The insulation plates 6 and 8 are contained in the interior of the casing including the upper casing member 2, on which the bus bars 9 are fixed, and the lower casing member 3. The insulation plate 8 is interposed between the bus bars 9 and the upper layer printed board 7 while the insulation plate 6 is interposed between the upper printed board 7 and the lower layer printed board 5.

As described above, the upper layer printed board 5 is interposed between the bus bars 9 and the insulation plate 6. The insulation plate 6 serves not to hold the bus bars 9 but to electrically insulate the printed boards 5 and 7.

Thus, because the bus bars contained in the electrical junction box are directly secured to the inner surface of the upper wall of the upper casing member, it is not necessary to caulk the bus bars onto the insulation plate. The prior art electrical junction box has required such caulking work.

Although the bus bars are fixed on the inner surface of the upper wall of the upper casing member in the first embodiment, the bus bars may be secured to an inner surface of a bottom wall of the lower casing member.

FIG. 8 shows a second embodiment of the electrical junction box in accordance with the present invention.

The second embodiment includes bus bars 40 and 41 as well as the bus bars 9 secured to the inner surface of the upper casing member in the first embodiment. These bus bars 40 and 41 are not caulked onto the insulation plate but secured to the insulation plate.

The bus bars 40 and 41 are laminated through an insulation plate 42. An upper layer bus bar 40 is disposed below the insulation plate 45 that is disposed below the bus bars 9 secured to the upper casing member 2. A lower layer bus bar 41 is disposed through the insulation plate 42 below the bus bar 40. An insulation plate 43 is disposed between the bus bar 41 and the bottom wall 3a of the lower casing member 3.

The upper layer bus bar 40 is provided with attaching pieces 40a and 40b as in the case of the first and second attaching pieces 20 and 21 of the bus bars 9. The insulation plate 45 disposed above the bus bar 40 is provided with a rectangular aperture 45a and a circular aperture 46a as in the case of the rectangular aperture 31 and circular aperture 32 in the inner wall of the upper casing member 2. The attaching pieces 40a and 40b are inserted into and secured to the rectangular aperture 45a and circular aperture 46a in the insulation plate 45, respectively.

Similarly, the attaching pieces 41a and 41b provided on the lower layer bus bar 41 are inserted into and secured to the rectangular aperture 42a and circular aperture 42b in the insulation plate 42 in the insulation plate 42, respectively.

Thus, three layers comprising the bus bars 40, 41 and 9 (the bus bars 9 is secured to the inner surface of the upper casing member 2) are not caulked onto the insulation plates but secured to the interior of the casing.

FIG. 9 shows a third embodiment of the electrical junction box in accordance with the present invention.

The third embodiment includes three layers comprising bus bars 9, 40, and 41 as is in the case with the second embodiment. First and second attaching pieces 40a and 40b of the upper layer bus bar 40 penetrate through-holes 45h in an insulation plate 45 and are inserted into and secured to a rectangular aperture 30 and a circular aperture 31 in the inner surface of the upper casing member 2.

First and second attaching pieces 41a and 41b of the lower layer bus bar 41 project toward a bottom wall 3a of a lower casing member 3, and are inserted into and secured to a rectangular aperture 3c and a circular aperture 3d in an inner surface of the bottom wall 3a.

Thus, three layers comprising the bus bars 40, 41 and 9 (the bus bars 9 is secured to the inner surface of the upper casing member 2) are not caulked onto the insulation plates but secured to the interior of the casing.

The exemplary embodiments are not limited to the above first to third embodiments. The attaching piece of the bus bar having a rectangular shape in cross section may be inserted into and secured to either a circular aperture or a rectangular aperture in the casing.

It will be appreciated that various of the above-disclosed embodiments and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. An electrical junction box comprising:
a casing having an inner surface and receiving apertures;
bus bars disposed on the inner surface of the casing; and
at least one attaching piece disposed on the bus bars and being inserted into and secured to at least one of the receiving apertures of the casing, the at least one attaching piece having a rectangular cross-section, each of the receiving apertures being a circular aperture or a rectangular aperture, at least a part of an outer peripheral wall of the at least one attaching piece contacting with an inner peripheral surface of the at least one of the receiving apertures to restrain the at least one attaching piece from moving in the at least one of the receiving apertures, thereby positioning and holding the bus bars in the casing,
wherein the circular aperture restrains a lateral or longitudinal movement of a first attaching piece and the rectangular aperture restrains rotary movement of a second attaching piece.

2. An electrical junction box according to claim 1 further comprising:
other bus bars in the casing; and
an insulation plate having receiving apertures, wherein the other bus bars are not caulked on said insulation plate, but are provided with a plurality of bent attaching pieces and inserted into and secured to the receiving apertures in the insulation plate or penetrated into openings defined by the insulation plate to project toward the casing so as to be inserted into and secured to receiving apertures in the inner surface of the casing.

3. An electrical junction box comprising:
a casing having an inner surface and receiving apertures;
bus bars disposed on the inner surface of the casing; and
at least one attaching piece disposed on the bus bars and being inserted into and secured to at least one of the receiving apertures of the casing, the at least one attaching piece having a rectangular cross-section, each of the receiving apertures being a circular aperture or a rectangular aperture, at least a part of an outer peripheral wall of the at least one attaching piece contacting with an inner peripheral surface of the at least one of the receiving apertures to restrain the at least one attaching piece from moving in the at least one of the receiving apertures, thereby positioning and holding the bus bars in the casing,
wherein the rectangular aperture is provided with opposed inner peripheral surfaces with a rib and the rib is brought into contact with an outer peripheral surface of the attaching piece.

4. An electrical junction box comprising:
a casing having an inner surface and receiving apertures;
bus bars disposed on the inner surface of the casing; and
at least one attaching piece disposed on the bus bars and being inserted into and secured to at least one of the receiving apertures of the casing, the at least one attaching piece having a rectangular cross-section, each of the receiving apertures being a circular aperture or a rectangular aperture, at least a part of an outer peripheral wall of the at least one attaching piece contacting with an inner peripheral surface of the at least one of the receiving apertures to restrain the at least one attaching piece from moving in the at least one of the receiving apertures, thereby positioning and holding the bus bars in the casing,
wherein a part of each of the bus bars is bent upward to provide a tab terminal adapted to be connected to electrical components, and the at least one attaching piece is bent in the same direction as that of the upward bent tab terminal, and
wherein the attaching piece inserted into and secured to the circular aperture is disposed near the tab terminal.

\* \* \* \* \*